United States Patent [19]
White

[11] Patent Number: 5,880,596
[45] Date of Patent: Mar. 9, 1999

[54] APPARATUS AND METHOD FOR CONFIGURING INTEGRATED CIRCUIT OPTION BITS WITH DIFFERENT BONDING PATTERNS

[75] Inventor: Thomas H. White, Santa Clara, Calif.

[73] Assignee: Altera Corporation, San Jose, Calif.

[21] Appl. No.: 808,074

[22] Filed: Feb. 28, 1997

Related U.S. Application Data

[60] Provisional application No. 60/030,338 Nov. 5, 1996.

[51] Int. Cl.$^6$ .................................................. H03K 19/173
[52] U.S. Cl. ............................................. 326/38; 326/82
[58] Field of Search ................................ 326/38, 37, 82; 327/526; 365/185.01, 185.25

[56] References Cited

U.S. PATENT DOCUMENTS

| | | | |
|---|---|---|---|
| 5,295,110 | 3/1994 | Sakakibara | 365/222 |
| 5,298,807 | 3/1994 | Salmon et al. | 326/83 |
| 5,300,840 | 4/1994 | Drouot | 307/530 |
| 5,361,003 | 11/1994 | Roberts | 326/83 |
| 5,412,333 | 5/1995 | Okunaga | 327/544 |
| 5,563,840 | 10/1996 | Hayakawa et al. | 365/230.01 |
| 5,682,105 | 10/1997 | Fujima | 326/38 |

Primary Examiner—Jon Santamauro
Assistant Examiner—Don Phu Le
Attorney, Agent, or Firm—Beyer & Weaver, LLP

[57] ABSTRACT

Disclosed is an integrated circuit design and method which provides optional configurations depending upon the connection of optional bond wires. The design retains the flexibility of the IC's mode of operation through the fabrication and testing of the wafers, until the packaging of the IC. ICs designed in accordance with the present inventions also provide advantages of size, efficiency and reliability over those previously known.

18 Claims, 5 Drawing Sheets

APPARATUS AND METHOD FOR CONFIGURING INTEGRATED CIRCUIT OPTION BITS WITH DIFFERENT BONDING PATTERNS

RELATED APPLICATIONS

This application claims the benefit of the filing date of Provisional Application Ser. No. 60/030,338, filed Nov. 5, 1996.

BACKGROUND OF THE INVENTION

The present invention relates generally to integrated circuits and methods for their use. More specifically, the invention relates to an integrated circuit design which is capable of being configured to perform multiple roles by using different bonding patterns.

Integrated circuits (ICs) are fabricated for many different purposes. As IC fabrication technology progresses, application flexibility generally decreases; that is, the roles for which an IC is suitable decrease with increasing specificity of design. For purposes of economy and efficiency, it is often desirable to leave an IC's role options unspecified for as long as possible.

Various strategies for retaining the flexibility of ICs as late as possible in the fabrication process are presently in use. Many ICs are designed to perform multiple roles. FIG. 1 illustrates an example of one such design. FIG. 1 shows a portion of an IC 10 having a voltage source ($V_{ss}$) 12 and a voltage drain ($V_{DD}$) 14. A metal line 16 is connected either to $V_{ss}$ 12 via a metal line 18 formed on the IC, or to $V_{DD}$ 14 via a metal line 20, depending on the design requirements at hand. Control over which line prints is provided by using a particular mask or reticle during the metalization patterning step used to form that layer of the IC 10.

If the connection to $V_{ss}$ 12 is made via metal line 18, the circuit is initialized to a low logic value when the chip is powered-up. This low logic value is converted by an inverter 22 to a high logic value on line 24, which adapts the IC to a particular role. For instance, the IC may recognize a high logic value on line 24 as a signal that it should expect a 5 Volt (V) power supply, whereas a low logic level on line 24 could indicate a 3 V power supply to the IC. The second option may be specified by connecting circuit line 16 to $V_{DD}$ 14 via line 20, rather than to $V_{ss}$ 12 via line 18.

This IC design permits a level of flexibility by allowing a decision regarding the role of an IC to be implemented at some time after the initial fabrication stage. However, this design still requires that the IC role be specified at a relatively early stage in the IC manufacturing process (i.e., at the metalization patterning stage). It would be advantageous to retain this flexibility for as long as possible, in particular as far as the packaging stage. In this way, foundries might be able to specify multiple roles for an IC starting from the same basic wafer design, and thereby reduce starting wafer inventories and associated costs.

FIGS. 2A and 2B illustrate IC designs which permit the flexibility in the IC to be retained until a later stage in the manufacturing process than the design of FIG. 1. FIG. 2A shows a portion of an IC 100. The IC 100 comprises a random access memory (RAM) bit 101 connected to a voltage source ($V_{ss}$) 102 and a voltage drain ($V_{DD}$) 104. Interposed between $V_{ss}$ 102 and $V_{DD}$ 104 are a p-channel transistor 106, and an EPROM (erasable-programmable read only memory) 108. The source of p-channel transistor 106 and the drain of EPROM 108 connect to the input of an inverter 112 through a line 110. The output of inverter 112 is connected to the remainder of the IC through a line 114.

Optional roles for this IC may be specified by programming the EPROM 108. When power is supplied to the chip, the IC attempts to bias the memory bit 101 to a high logic value with a negative bias, nINIT, applied to the gate of p-channel transistor 106. But when the EPROM 108 is programmed to be conductive, this high logic level is overcome by the ground connection to $V_{ss}$ 102 and the RAM bit is initialized to a low logic level. This low logic level is inverted by the inverter 112 to a high logic level, which adapts the IC to a particular role. For instance, the IC could interpret a high logic value on the RAM bit line 114 to indicate a 5 V power supply. Where the EPROM 108 is not conductive, the high logic value on line 110 is inverted to a low logic value by the inverter 112 and provided to the remainder of the IC, adapting it to an alternate role, such as 3 V operation. A fuse may also be used in place of the EPROM 108. The fuse could then be blown or left intact to specify the IC's role.

This design provides additional flexibility, since the same fabrication process can be used for ICs having the option of performing multiple roles. The EPROM may be programmed at the foundry during the testing of die on the wafers, for adaptation of the IC to the particular role intended by the user. The EPROM may even be programmed and reprogrammed by the user following receipt of the chip by normal EPROM erasing/programming methods.

FIG. 2B shows an alternate EPROM IC design. Memory bit 150 incorporates a latch 152 which provides a feedback mechanism for maintaining the logic values on either side of the inverter 154. This feedback latch 152 is combined with a POR (power-or-reset) switch (not shown) which triggers the p-channel transistor 156 to switch off, so that it no longer conducts once there is sufficient voltage for normal operation of the IC upon power-up. Thus, once the POR threshold is reached, the circuit no longer consumes power through p-channel 156. The IC's role-determining logic values are thereafter maintained by the latch 152, which comprises strong and weak inverters. The strong inverter 154 propagates the inverse of the input logic value to the remainder of the IC so that the IC role is set. The weak inverter 158 returns the input value to the initiation point so that both logic values are maintained.

When operating properly, this alternative EPROM structure of FIG. 2B provides an energy savings over the basic EPROM structure of FIG. 2A, since the p-channel transistor does not conduct and thus reduces the power consumption. However, POR varies with environmental and process conditions, and is sometimes difficult to determine. As a result, in normal operation POR can fluctuate, for instance, below the minimum voltage necessary for operation of the EPROM. In this instance, the POR switch can open to remove power from the IC before the proper role signal is generated and read. Under these circumstances, the device is defective. Accordingly, this energy-saving EPROM implementation may be unreliable.

Moreover, because EPROMs must be present in an array, they take up much more space on a chip than a discrete device would. EPROMs also require programming which increases the overhead associated with ICs which incorporate them.

Thus, there is a need for an improved IC design which maintains flexibility until as late as possible in the manufacturing process, in particular as late as the packaging stage. The design should ideally be compact, energy efficient and reliable.

SUMMARY OF THE INVENTION

The present invention provides an IC design and method which provides optional configurations depending upon the connection of optional bond wires. For example, a single leadframe (or other package) pin may be bonded optionally to two or more nearby bonding pads. Connecting the pin to one pad specifies one option, while connecting to a second pad specifies a second option. The design retains the flexibility of the IC's role through the fabrication and testing of the wafers, until the packaging of the IC. ICs designed in accordance with the present invention also provide advantages of size, efficiency and reliability over those previously known.

An integrated circuit according to the present invention has an active area having a circuit with an input and an output. The output value, which depends upon the input value, specifies a mode of operation for the IC. The IC also preferably includes an input/output area having at least one bonding pad electrically connected to the circuit input, and a package having a plurality of pins, including at least one input pin providing a signal which can operate as an input signal for the circuit. The IC optionally includes a bond wire electrically connecting at least one bonding pad to at least one input pin of the package. The integrated circuit may be adapted to operate in at least one mode when the bond wire is absent, and in at least a second mode when the bond wire is present.

In a specific embodiment of the present invention, the active area includes at least one bit of random access memory. The IC also has an input/output area with at least one bonding pad electrically connected to the input of a static random access memory bit. The IC is packaged in a leadframe. In order to specify the desired mode of operation of the IC, a bond wire is optionally electrically connected between at least one bonding pad and at least one leadframe input pin.

An integrated circuit may be designed according to the present invention so that it is capable of optionally performing a variety of roles (operating in a variety of modes) depending upon the bonding patterns selected. Examples of these options include power supply levels (e.g., 3 V or 5 V) and programmable logic device array size (e.g., 128 K or 256 K).

Integrated circuits designed in accordance with the present invention may also contain energy-conserving circuitry, such as a latch capable of maintaining the charge state of a memory bit upon inactivation of a p-channel initialization transistor following initialization of that bit.

The present invention further provides a method of using the IC of the present invention to adapt an integrated circuit capable of performing a plurality of roles to perform at least one of its optional roles. The method involves the connection of at least one bonding pad in the input/output area of the IC to at least one pin in the IC package.

Among the advantages of the present invention are increased flexibility of option implementation over prior art designs. The invention also provides improved reliability and energy efficiency in a relatively compact package.

These and other features and advantages of the invention will be described in more detail below with reference to the drawings.

DETAILED DESCRIPTION OF THE PREFERRED EMBODIMENTS

The present invention will be described in terms of a preferred embodiment. It will be understood by those skilled in the art that variations of the described method and apparatus may be made without departing from the scope of the present invention.

Figure 1:
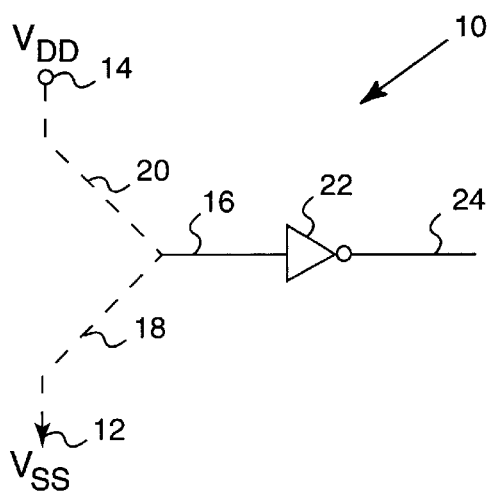
FIG. 1 is a schematic representation of a portion of an optional multiple role integrated circuit wherein role specification is achieved by forming a line of metalization in one of two positions during the latter stages of the fabrication process.
Figure 2A:
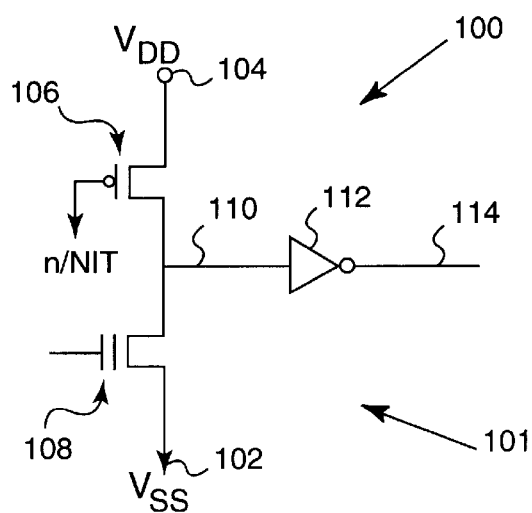
FIG. 2A is a schematic representation of a portion of an optional multiple role integrated circuit wherein role specification is achieved by programming an EPROM incorporated in to the IC.
Figure 2B:
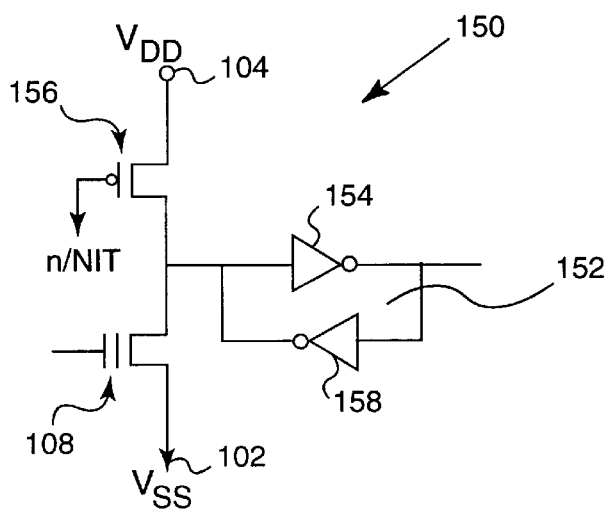
FIG. 2B is a schematic representation of the IC of FIG. 2A, modified to include a latch to provide greater energy efficiency.
Figure 3A:
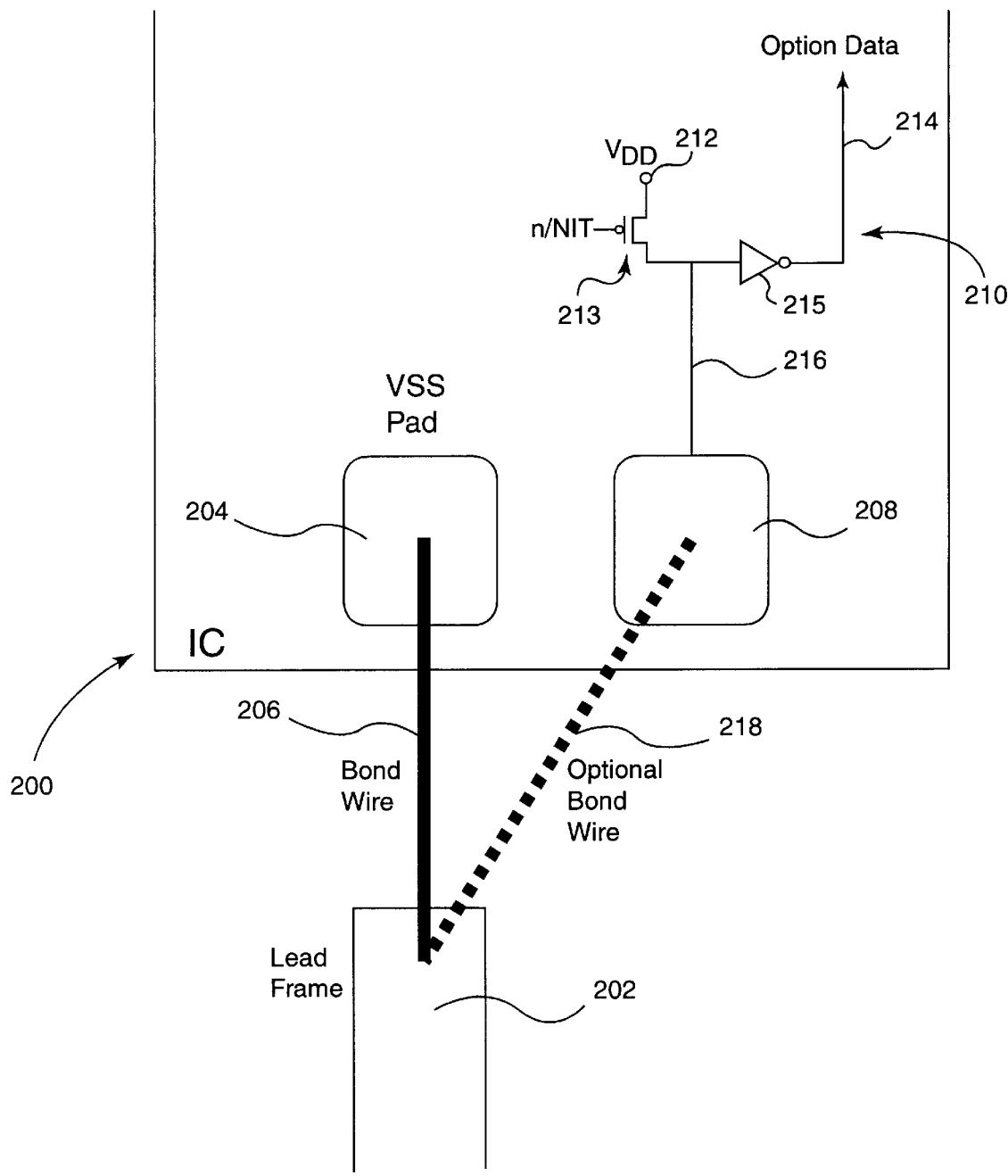
FIG. 3A is a schematic representation of a portion of an optional multiple role integrated circuit having multiple bonding patterns according to one embodiment of the present invention.

In a preferred embodiment illustrated in FIG. 3A, a portion of an integrated circuit (IC) 200 is shown. ICs are generally placed in a leadframe which comprises a plurality of pins useful for making electrical connections to the IC. These connections may be made by connecting a bond wire between a pin of the leadframe which receives or supplies an appropriate electrical signal, and bond pads located on the IC, generally on the periphery. In FIG. 3A, a leadframe pin 202, which is connected to ground ($V_{ss}$), is connected to a pad 204 on the IC 200 by a bond wire 206. This pad 204 may be connected to circuitry on the IC which requires a ground ($V_{ss}$) signal. This simple connection between pin 202 and pad 204 specifies one option.

The IC shown in FIG. 3A also has a second bond pad 208 ("option pad") to which a RAM bit (in this case SRAM) 210 on the IC 200 is connected. This SRAM bit 210 is designed to specify which of a plurality of possible roles the IC is intended to perform. The SRAM bit 210 comprises a power node ($V_{DD}$) 212 connected via a weak p-channel transistor 213 and a line 214 to the remainder of the IC (not shown), and to bond pad 208 via a line 216. An inverter 215 is directly connected to pad 208 and the source of p-channel transistor 213 through the intersection of lines 214 and 216. Inverter 215 also connects to the output of the SRAM as shown. Option pad 208 may optionally be connected to pin 202 via optional bond wire 218, while at the same time pad 204 is connected to pin 202 via wire 206.

When the IC 200 is powered-up, the IC attempts to bias memory bit ("option bit") 210 to a high logic value with a negative bias signal, nINIT, to the gate of p-channel transistor 213. If optional bond wire 218 is not present, the memory bit is initialized to a high logic value. In the preferred embodiment of FIG. 3A, this high logic value is converted to a low logic value by inverter 215. The inverted value then proceeds through the remainder of SRAM 210 and into the remainder of IC 200 via line 214, signaling a particular role for the IC, for example, 3 V operation.

Alternatively, if optional bond wire 218 is present, the high logic value which nINIT attempts to place on the option bit 200 is overcome by the hard connection to ground via line 216. While the signal on line 216 in this instance is not pulled completely to ground by this connection via bond wire 218, the signal entering the inverter 215 has a low logic value. This signal is converted to an unambiguous high logic value by the inverter and provided to the remainder of the IC 200 via line 214, signaling a different role for the IC 200, for example, 5 V operation.

In this way, the specification of the role of an IC may be delayed until the packaging stage of the IC manufacturing process. Of course, ICs fabricated to provide the flexibility of optional multiple roles must be constructed to accommodate either (or any) of the possible roles. For instance, if an IC may operate at 3 V or 5 V depending on a role selection, the IC architecture must be capable of operating effectively at 3 V or at 5 V. The same is true for any other optional roles for an IC. Satisfaction of this requirement is particularly important where alternative roles place different types or amounts of physical stress on an IC.

Figure 3B:
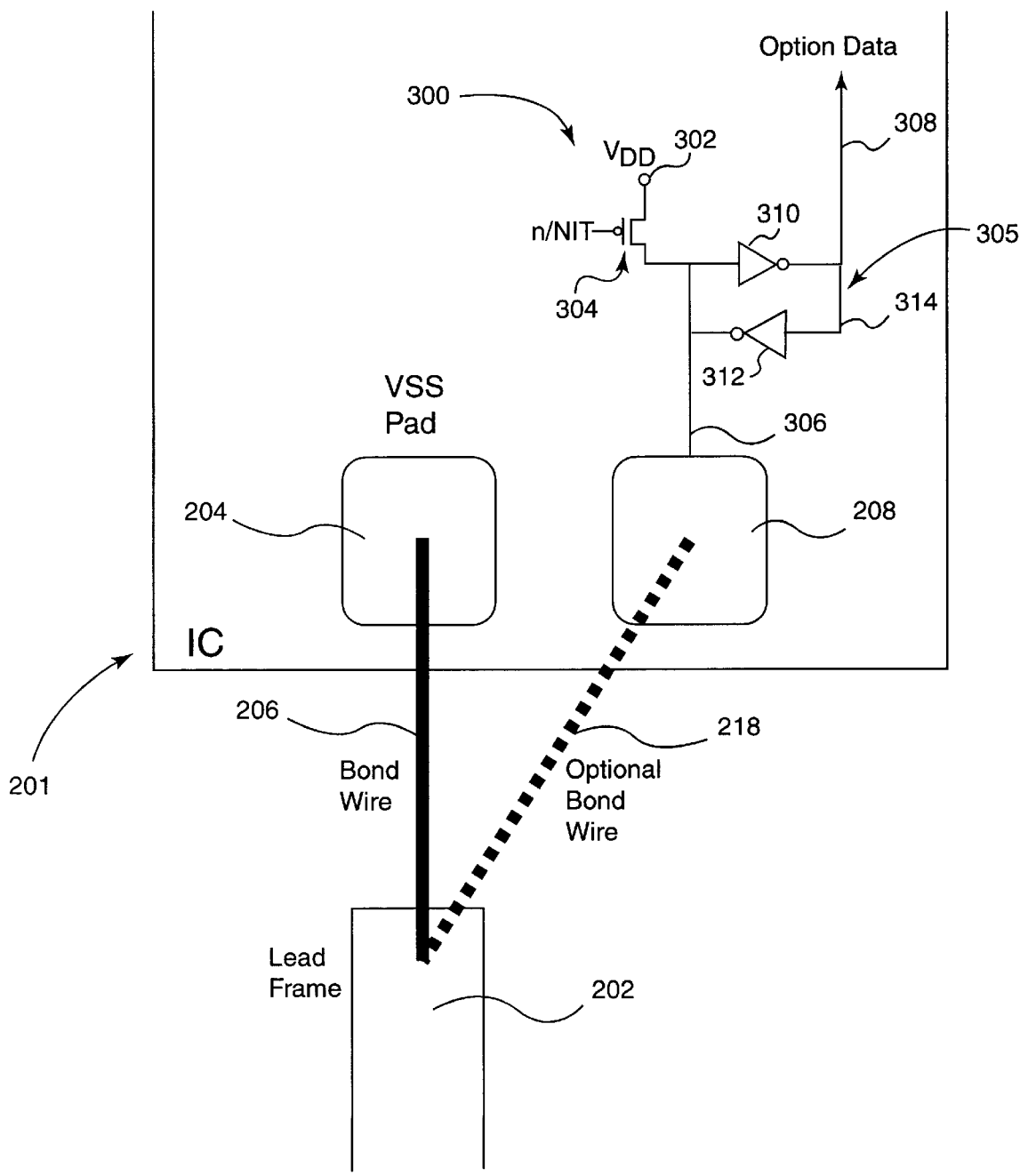
FIG. 3B is a schematic representation of a portion of a second optional multiple role integrated circuit according to the present invention.

FIG. 3B shows a second preferred embodiment of the present invention in which a p-channel transistor used to initialize the option bit is only active during the power-up sequence. This embodiment provides for greater power efficiency relative to the device of FIG. 3A. SRAM 300 comprises a voltage drain ($V_{DD}$) node 302 connected to a feedback latch 305 via p-channel transistor 304. SRAM 300 is connected to option pad 208 via a line 306 and to the remainder of an IC 201 via line 308. Feedback latch 305 comprises strong inverter 310 and weak inverter 312.

As in the presently used EPROM-based chips, upon power-up, the IC attempts to bias memory bit 300 to a high logic value with the signal nINIT to p-channel transistor 304. Memory bit 300 incorporates latch 305 which provides a feedback mechanism for maintaining the logic values on either side of the inverter 310. This latch 305 is combined with a POR (power-or-reset) switch (not shown) which triggers the p-channel transistor 304 to switch off, so that it no longer conducts once there is sufficient voltage for normal operation of the IC upon power-up. Once the POR threshold is reached, the circuit no longer consumes power through p-channel transistor 304. The IC's role-determining logic values are thereafter maintained by the feedback latch 305, which, as noted, comprises strong and weak inverters. The strong inverter 310 propagates the inverse of the input logic value to the remainder of the IC so that the IC role is set. The weak inverter 312 returns the input value to the initiation point so that both values are maintained.

The present invention overcomes the unreliability of the energy-conserving EPROM-based chips. The role option is determined by the presence or absence of an optional bond wire rather than the function of a device with specific power requirements (e.g., an EPROM). The operation of this design, therefore, is not susceptible to the variability of POR. Accordingly, the design provides an efficient and reliable solution for a multiple role option IC.

The RAM bit may also be constructed to provide electrical access to the contents of the bit so that the manufacturer may test both options during the wafer sort, and to distinguish between the die after bonding is completed.

Figure 4A:
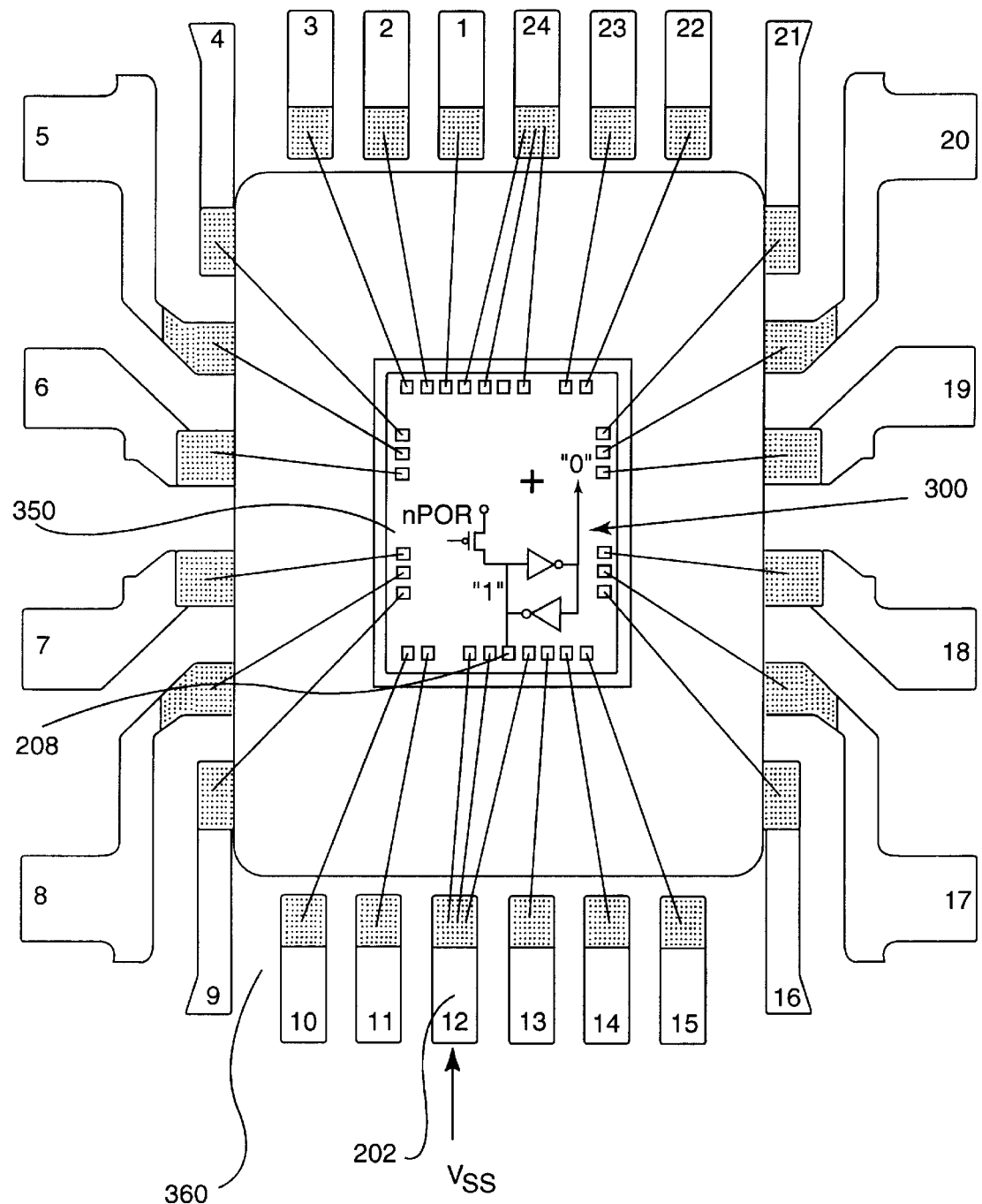
FIG. 4A is a schematic representation of a portion of an optional multiple role integrated circuit according to the present invention shown in a leadframe and having a first option specified.
Figure 4B:
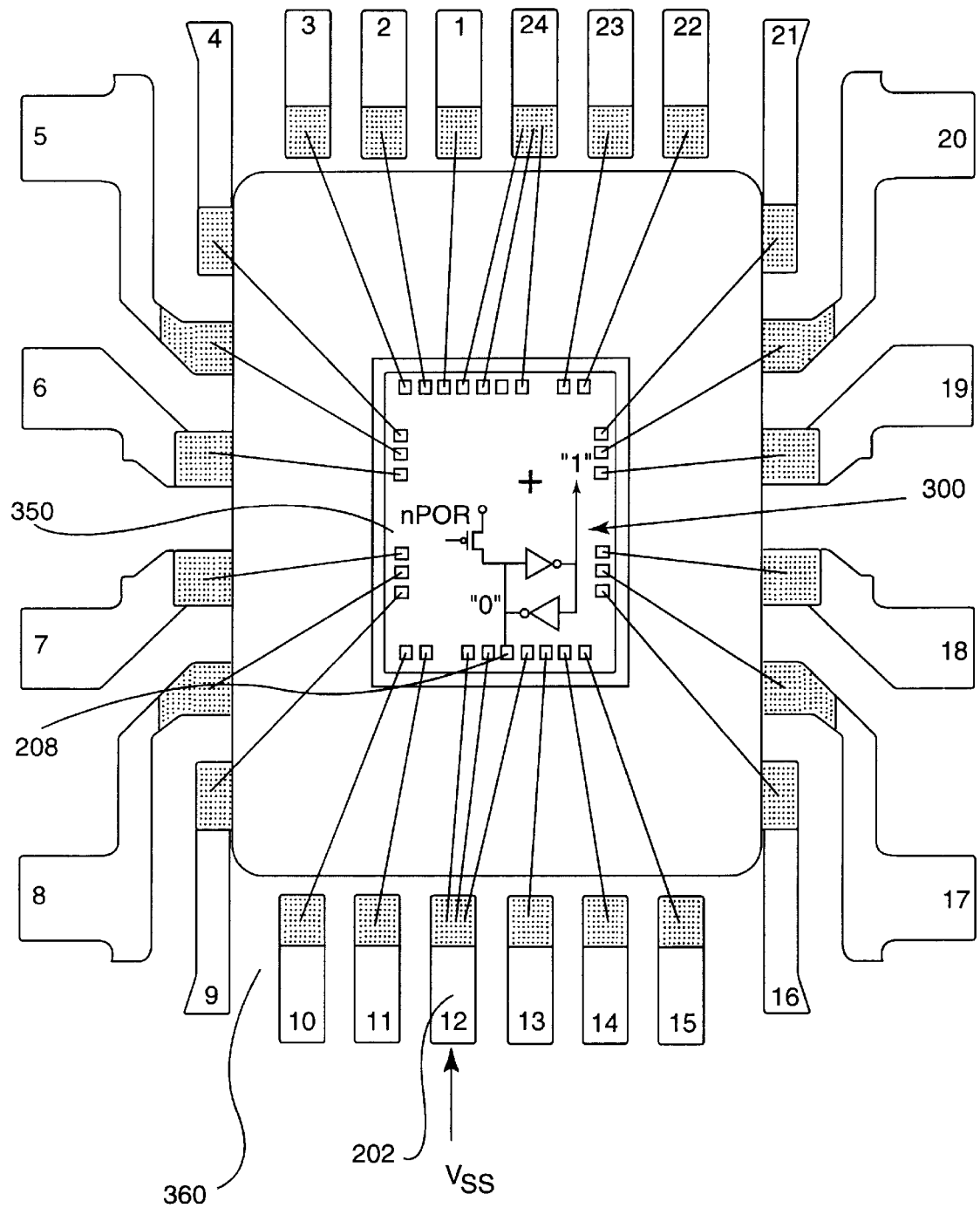
FIG. 4B is a schematic representation of a portion of an optional multiple role integrated circuit according to the present invention shown in a leadframe and having a second option specified.

FIGS. 4A and 4B show a more complete (albeit exaggerated) view of a specific IC-leadframe combination of the present invention. FIG. 4A depicts the chip where the option bond pad 208 on the active area 350 is not bonded to leadframe pin 202 ($V_{ss}$) in the input/output area 360, thereby setting the option bit to a low logic level indicating a certain role. FIG. 4B depicts the chip where the option bond pad 208 is bonded to leadframe pin 202 ($V_{ss}$), thereby setting the option bit to a high logic level indicating a different role.

The IC of the present invention retains its flexibility through the fabrication and testing of the wafers. The option need only be specified by connection of the bond wire (or not) during the packaging of the IC. ICs designed in accordance with the present invention also provide advantages of size, efficiency and reliability over those previously known.

A variety of different role options may be selected on ICs designed in accordance with present invention. The example of power supply voltages has been noted. Another possible option is EPROM array size. A single chip can be manufactured that is capable of operating as a 256 kilobit logic device or a 128 kilobit logic device depending on the connection of an optional bond wire. Further, the invention may be applied to the selection of alternative clock speeds for an IC. Many other options are also possible. Moreover, one or more option bits may be present within a single IC to select various options in accordance with the present invention.

Still further, the package to which the bonding pads are wired need not be a leadframe. For example, a "flip chip" package will work as well as a leadframe. In a flip chip design, solder balls are provided on bonding pads distributed over the active surface of a die. Packaging is accomplished by contacting the solder balls to a packaging substrate having leads to pins leading out of the package. A flip chip used in accordance with this invention will include an optional bond pad. Whether it is connected (specifying a particular option) depends upon (1) whether a solder ball is applied to the bond pad, and (2) whether the packaging substrate includes a contact region for the option bond pad. If both of these conditions are not met, then the option bond pad may not be connected. Other packaging designs may also be employed, so long as they allow for the optional connection to a die contact.

It should also be understood that the present invention is not limited to the circuits depicted in FIGS. 4A and 4B. For example, the pin for optional connection to the option bond pad could be a power pin ($V_{DD}$) rather than a $V_{ss}$ pin. In this case, the "die-side" connection to the p-channel transistor should be $V_{ss}$.

Although a specific embodiment of the present invention has been described in detail, it should be understood that the present invention may be embodied in many other specific forms without departing from the spirit or scope of the invention as recited in the claims.

What is claimed is:

1. An integrated circuit, comprising:
   an active area having a circuit including an input and an output, a value associated with the output depending upon a value associated with the input, the output value specifying a mode of operation for the integrated circuit;
   an input/output area having at least one bonding pad electrically connected to said circuit input;
   a package having a plurality of pins, including at least one input pin providing a signal which can operate as an input signal for the circuit; and optionally, a bond wire electrically connecting said at least one bonding pad to the at least one input pin of said package;

whereby said integrated circuit is adapted to operate in a first mode with a power supply of a first voltage when said bond wire is absent, and said integrated circuit is adapted to operate in a second mode with a power supply of a second voltage when said bond wire is present.

2. The integrated circuit of claim 1, wherein said first voltage is 3 volts and said second voltage is 5 volts.

3. The integrated circuit of claim 1, wherein said first mode is operation as a programmable logic device of a first size and said second mode is operation as a programmable logic device of a second size.

4. The integrated circuit of claim 3, wherein said first size is 128 kilobits and said second size is 256 kilobits.

5. The integrated circuit of claim 1, wherein said at least one input pin of said package is connected to ground.

6. The integrated circuit of claim 1, wherein said at least one bonding pad is not connected to said at least one input pin of said package.

7. The integrated circuit of claim 1, wherein said circuit comprises at least one bit of random access memory.

8. The integrated circuit of claim 7, wherein said at least bit of random access memory comprises at least one bit of static random access memory.

9. The integrated circuit of claim 8, wherein said at least one bit of static random access memory comprises a p-channel transistor which is active to initialize said at least one bit during a power-up sequence of said integrated circuit.

10. The integrated circuit of claim 9, wherein said at least one bit of static random access memory comprises an inverter.

11. The integrated circuit of claim 9, wherein said at least one bit of static random access memory comprises a latch capable of maintaining the charge state of said at least one bit upon inactivation of said p-channel transistor following initialization of said at least one bit.

12. The integrated circuit of claim 1, wherein said package comprises a leadframe.

13. The integrated circuit of claim 1, wherein said circuit includes a plurality of inputs and outputs, said input/output area has a plurality of bonding pads connected to said inputs, and said package has at least one input pin optionally connected to said bonding pads, whereby said integrated circuit is capable of having more than two modes specified.

14. The integrated circuit of claim 13, wherein said specified modes include power supply level and programmable logic device size.

15. A method of specifying the mode of operation of an integrated circuit capable of operating in at least two modes, wherein said first mode is operation with a power supply of a first voltage and said second mode is operation with a power supply of a second voltage, said integrated circuit comprising:

an active area having a circuit including an input and an output, a value associated with the output depending upon a value associated with the input, the output value specifying a mode of operation for the integrated circuit;

an input/output area having at least one bonding pad electrically connected to said circuit input;

a package having a plurality of pins, including at least one input pin providing a signal which can operate as an input signal for the circuit; and said method comprising electrically connecting said at least one bonding pad to the at least one input pin of said package.

16. The method of claim 15, wherein said connection is made during packaging of said integrated circuit.

17. The method of claim 15, wherein said first mode is operation as a programmable logic device of a first size and said second role is operation as a programmable logic device of a second size.

18. The method of claim 15, wherein said circuit includes a plurality of inputs and outputs, said input/output area has a plurality of bonding pads connected to said inputs, and said electrical connecting optionally connects more than one bonding pad to the at least one input pin of said package, whereby more than two modes of operation for said integrated circuit are specified.

* * * * *